United States Patent
Parker et al.

(10) Patent No.: US 6,960,917 B2
(45) Date of Patent: Nov. 1, 2005

(54) METHODS AND APPARATUS FOR DIAGNOSING DEFECT LOCATIONS IN ELECTRICAL PATHS OF CONNECTORS OF CIRCUIT ASSEMBLIES

(75) Inventors: Kenneth P. Parker, Fort Collins, CO (US); Nurwati Suwendi Devnani, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/703,944

(22) Filed: Nov. 6, 2003

(65) Prior Publication Data

US 2005/0099186 A1 May 12, 2005

(51) Int. Cl.[7] ............................................. G01R 31/02
(52) U.S. Cl. ...................................... 324/538; 324/555
(58) Field of Search .............................. 324/537, 754, 324/756–765, 158.1, 679, 686, 538, 555

(56) References Cited

U.S. PATENT DOCUMENTS

| | | | | |
|---|---|---|---|---|
| 5,254,953 A | * | 10/1993 | Crook et al. | 324/538 |
| 5,391,993 A | * | 2/1995 | Khazam et al. | 324/684 |
| 5,420,500 A | | 5/1995 | Kerschner | 324/72.5 |
| 5,498,964 A | | 3/1996 | Kerschner et al. | 324/530 |
| 5,557,209 A | | 9/1996 | Crook et al. | 324/537 |
| 5,631,572 A | * | 5/1997 | Sheen et al. | 324/754 |
| 6,087,842 A | * | 7/2000 | Parker et al. | 324/763 |
| 6,097,203 A | | 8/2000 | Parker et al. | 324/763 |

FOREIGN PATENT DOCUMENTS

| | | |
|---|---|---|
| JP | 53096786 | 8/1978 |
| JP | 02143188 | 6/1990 |
| WO | WO 99/39395 | 8/1999 |

OTHER PUBLICATIONS

Kenneth P. Parker, et al., "Methods and Apparatus for Testing Continuity of Electrical Paths Through Connectors of Circuit Assemblies", U.S. Appl. No. 10/683,693, filed Oct. 9, 2003.

* cited by examiner

Primary Examiner—Vincent Q. Nguyen

(57) ABSTRACT

In a method for testing continuity of electrical paths through a connector, pairs of contacts of the connector are coupled via a first plurality of passive circuit components. The contacts are also coupled to a test sensor port via a second plurality of passive circuit components, ones of which are coupled in parallel to the test sensor port. The method proceeds with stimulating one or more nodes of the connector, and then measuring an electrical characteristic via the test sensor port. Finally, the measured electrical characteristic is compared to at least one threshold to assess continuities of at least two electrical paths through the connector.

24 Claims, 6 Drawing Sheets

| DEFECT | MEASURED CAPACITANCE |
|---|---|
| None | C |
| Contact A open | 2*C |
| Contact B open | 0 |
| Contact C open | 3*C |
| Contacts A and B open | 0 |
| Contacts A and C open | 4*C |
| Contacts B and C open | 0 |
| All contacts open | 0 |

US 6,960,917 B2

METHODS AND APPARATUS FOR DIAGNOSING DEFECT LOCATIONS IN ELECTRICAL PATHS OF CONNECTORS OF CIRCUIT ASSEMBLIES

BACKGROUND OF THE INVENTION

During manufacture, circuit assemblies (e.g., printed circuit boards and Multi-Chip Modules) need to be tested for interconnect defects such as open solder joints, broken connectors, and bent or misaligned leads (e.g., pins, balls, or spring contacts). One way to test for such defects is via capacitive lead-frame testing.

FIGS. 1 & 2 illustrate an exemplary setup for capacitive lead-frame testing. FIG. 1 illustrates a circuit assembly 100 comprising an integrated circuit (IC) package 102 and a printed circuit board 104. Enclosed within the IC package is an IC 106. The IC is bonded to the leads 108, 110 of a lead-frame via a plurality of bond wires 112, 114. The leads, in turn, are meant to be soldered to conductive traces on the printed circuit board. Note, however, that one of the leads 108 is not soldered to the printed circuit board, thereby resulting in an "open" defect.

Positioned above the IC package 102 is a capacitive lead-frame test assembly 116. The exemplary test assembly 116 shown comprises a sense plate 118, a ground plane 120, and a buffer 122. The test assembly is coupled to an alternating current (AC) detector 124. A first, grounded test probe, $TP_{13}$ 1, is coupled to lead 110 of the IC package. A second test probe, $TP_{13}$ 2, is coupled to lead 108 of the IC package. The second test probe is also coupled to an AC source 126.

FIG. 2 illustrates an equivalent circuit for the apparatus shown in FIG. 1. In the equivalent circuit, $C_{Sense}$ is the capacitance seen between the sense plate 118 and the lead 108 being sensed, and $C_{Joint}$ is the capacitance seen between the lead 108 and the conductive trace (on the printed circuit board) to which the lead is supposed to be soldered. The switch, S, represents the quality of the lead being tested. If the lead being tested is good, switch S is closed, and the capacitance seen by the AC detector is $C_{Sense}$. If the lead being tested is bad, switch S is open, and the capacitance seen by the AC detector is $C_{Sense}*C_{Joint}/(C_{Sense}+C_{Joint})$. If $C_{Sense}$ is chosen to be significantly larger than any possible $C_{Joint}$, a bad lead will result in the AC detector seeing a capacitance near $C_{Joint}$. As a result, the AC detector must have sufficient resolution to distinguish $C_{Sense}$ from $C_{Joint}$.

Additional and more detailed explanations of capacitive lead-frame testing are found in U.S. Pat. No. 5,557,209 of Crook et al. entitled "Identification of Pin-Open Faults by Capacitive Coupling Through the Integrated Circuit Package", and in U.S. Pat. No. 5,498,964 of Kerschner entitled "Capacitive Electrode System for Detecting Open Solder Joints in Printed Circuit Assemblies".

Over the years, various factors have interfered with the success of capacitive lead-frame testing. One factor is a lack of capacitive coupling between an IC lead-frame and a tester's sense plate. This problem is largely traced to the on-going miniaturization of IC packages and their lead-frames, as well as the imposition of ground shield and heat sinks between lead-frames and the sensor plate (some of which are internal to an IC's package). The miniaturization of lead-frames is also exacerbated by "area connection" packages. In an area connection package, the package's lead-frame is laid out as an array on a surface of the package, rather than in rows along the edges of the package. Examples of package area connections include ball grid arrays (BGAs; a lead-frame comprising a plurality of solder balls on a surface of a package) and land grid arrays (LGAs; a lead-frame comprising a plurality of stenciled or screened contact pads on a surface of a package). Area connection packages can be advantageous in that they often minimize the lengths of signal traces coupling a package's IC to its lead-frame. However, they can also interfere with capacitive lead-frame testing in that they sometimes make it difficult to position the sense plate of a capacitive lead-frame tester in close enough proximity to their lead-frames.

One way to address some of the problems of IC miniaturization is disclosed in U.S. Pat. No. 6,087,842 of Parker et al. entitled "Integrated or Intrapackage Capability for Testing Electrical Continuity Between an Integrated Circuit and Other Circuitry". This patent teaches the placement of a capacitive sensor interior to an IC package. If the placement of such sensor is carefully chosen, the capacitive coupling between the sensor and a package's lead-frame can be increased—in part because the interior placement of the capacitive sensor can circumvent shielding and heat dissipation structures of the IC package.

Another factor that has interfered with the success of capacitive lead-frame testing is the ratio of non-signal leads to total leads on an IC package. As ICs have become more complex and operate at higher frequencies, the ratio of non-signal leads as a fraction of total leads has increased. Typically, the non-signal leads supply power and/or ground connections, and are redundantly connected in parallel (either on a printed circuit board, within an IC package, or within an IC itself). Capacitive lead-frame testing is not designed to detect opens on such leads. Thus, a significant fraction of IC leads could suffer from opens that cannot be tested.

Yet another factor that has interfered with the success of capacitive lead-frame testing is socket-mounted IC packages. These packages do not mount directly to a board, but are mounted in sockets that allow them to be added or replaced after a board is manufactured. This adds a layer of complexity to testing in that proper connection between the board and package requires proper connection between the board and socket. If the package is placed in the socket, both sets of connections (i.e., between board and package, and between board and socket) can be tested at once via In-Circuit test, Boundary-Scan test, capacitive lead-frame test, and so on. However, all of these techniques depend on the inserted device's inherent testability for opens coverage; and even if the inserted device is suited to application of these techniques, only signal leads will be adequately tested, and redundant power and ground connections will only be "grossly" tested. If the inserted device has poor testability, neither the inserted device nor the socket will be adequately tested.

SUMMARY OF THE INVENTION

One aspect of the invention is embodied in a device for testing continuities of electrical paths through a connector of a circuit assembly. The device comprises a package containing incomplete or no mission circuitry for the circuit assembly. A plurality of contacts are provided on the package for mating to a plurality of contacts of the connector. A test sensor port is integrated with the package. A first plurality of passive circuit components are integrated with the package, each of which is coupled in parallel between one of the contacts on the package and the test sensor port. A second plurality of passive circuit components is also integrated with the package, ones of which are coupled between ones of the plurality of contacts on the package.

Another aspect of the invention is embodied in a method for testing continuity of electrical paths through a connector. The method comprises coupling pairs of contacts of the connector via a first plurality of passive circuit components. The contacts are also coupled to a test sensor port via a second plurality of passive circuit components, each of which is coupled in parallel between one of the contacts and the test sensor port. After stimulating one or more nodes of the connector, an electrical characteristic is measured via the test sensor port. The measured electrical characteristic is then compared to at least one threshold to assess continuities of at least two electrical paths through the connector.

Other embodiments of the invention are also disclosed.

BRIEF DESCRIPTION OF THE DRAWINGS

Illustrative and presently preferred embodiments of the invention are illustrated in the drawings, in which.

DESCRIPTION OF THE PREFERRED EMBODIMENT

The United States patent application of Kenneth P. Parker, et al. entitled "Methods and Apparatus for Testing Continuity of Electrical Paths Through Connectors of Circuit Assemblies" (Ser. No. 10/683,693, hereby incorporated by reference) discloses how to determine whether defects exist in one or more of a plurality of electrical paths through a connector. One exemplary apparatus disclosed in the afore-mentioned patent application is a device comprising a plurality of capacitors that are coupled in parallel between 1) a test sensor port that is integrated with a package, and 2) a plurality of contacts on the package. When the device is mated to a connector having a plurality of electrically coupled contacts (e.g., a connector having redundant ground contacts), stimulation of the electrically coupled contacts should result in a capacitance of N*C being seen at the test sensor port (where N is the number of redundant contacts of the connector, and C is the value of each of the device's parallel capacitors). If there is an open in one of the paths through the redundant contacts, then the capacitance seen at the test sensor port will be (N−1)*C, with further reductions in capacitance being attributed to additional opens. An unresolved question, however, is, "If a defect exists, where is the defect in relation to the redundant contacts?" Although the afore-mentioned patent application discloses how to diagnose the locations of defects using intersecting sets of capacitors, other means for diagnosing the locations of defects would be desirable. To this end, disclosed herein are means for diagnosing the locations of defects by using coupling capacitances to couple one or more pairs of connector contacts.

Figure 1:
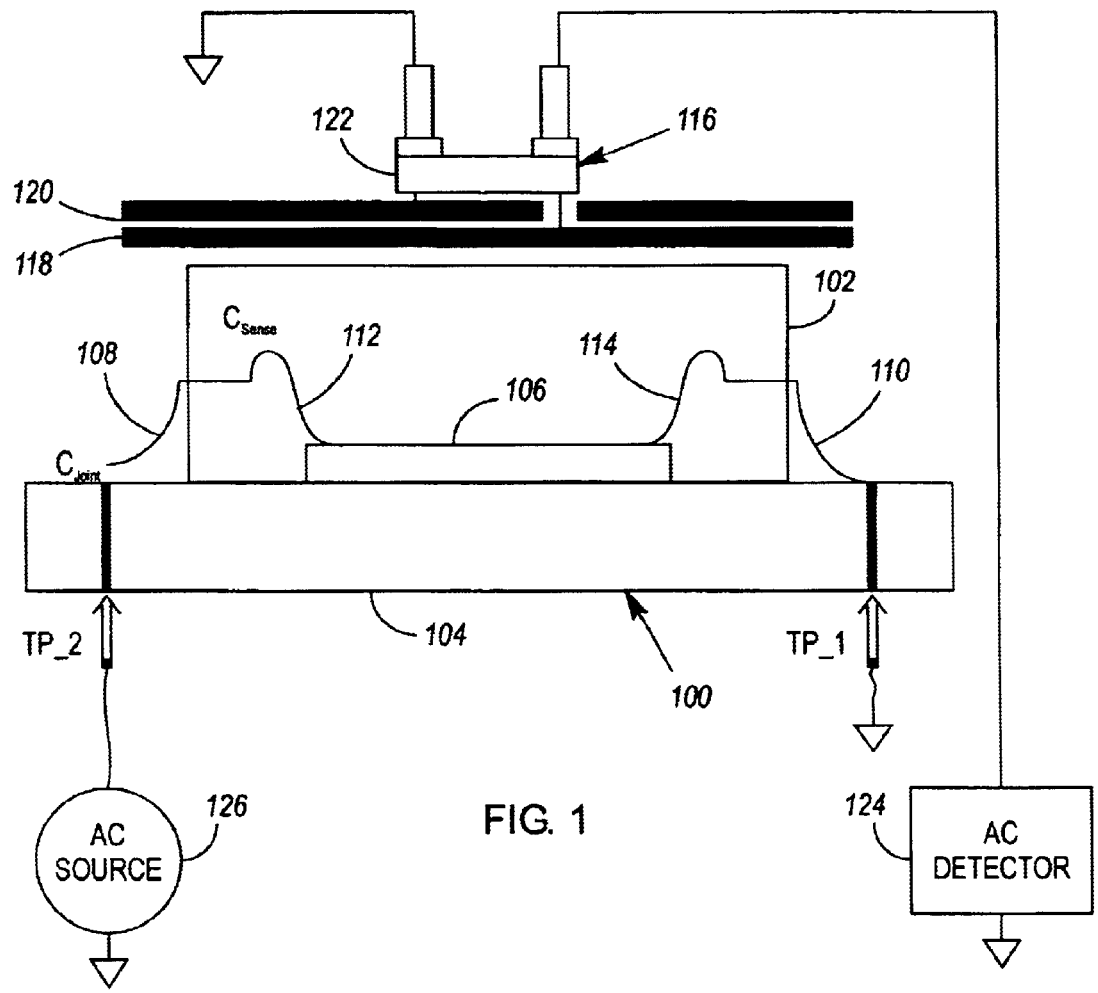
FIGS. 1 & 2 illustrate an exemplary setup for capacitive lead-frame testing.
Figure 2:
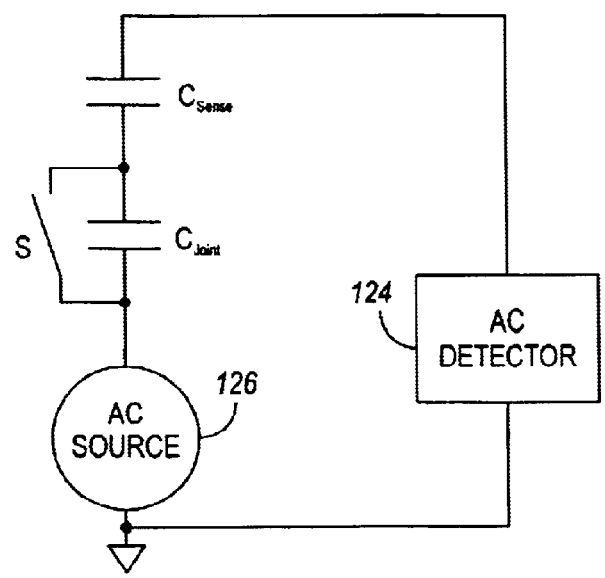
Figure 3:
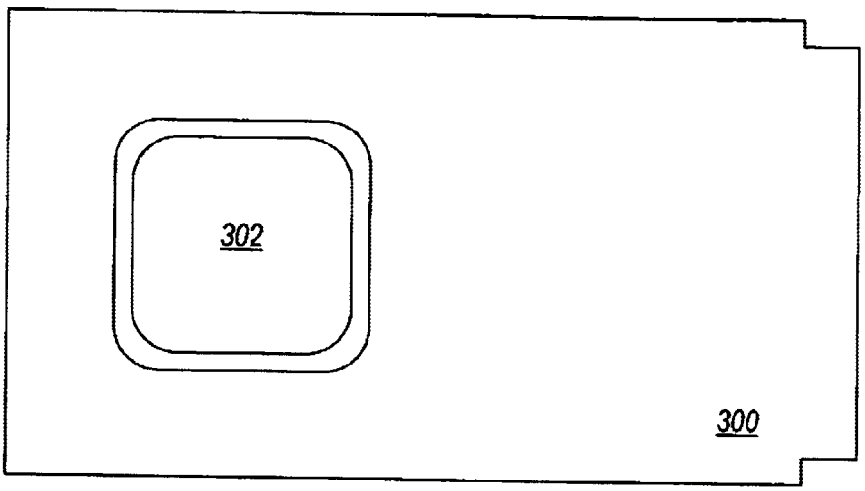
FIGS. 3 & 4 illustrate circuit assemblies comprising various forms of connectors.
Figure 4:
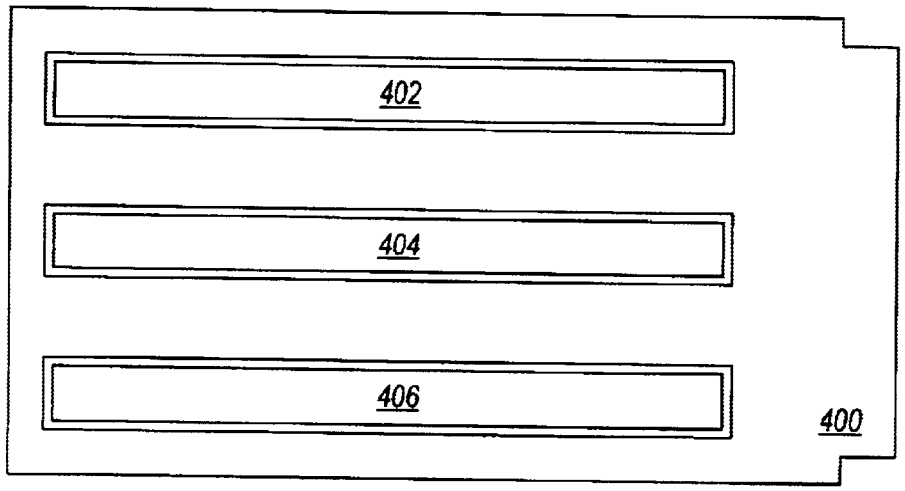
Figure 5:
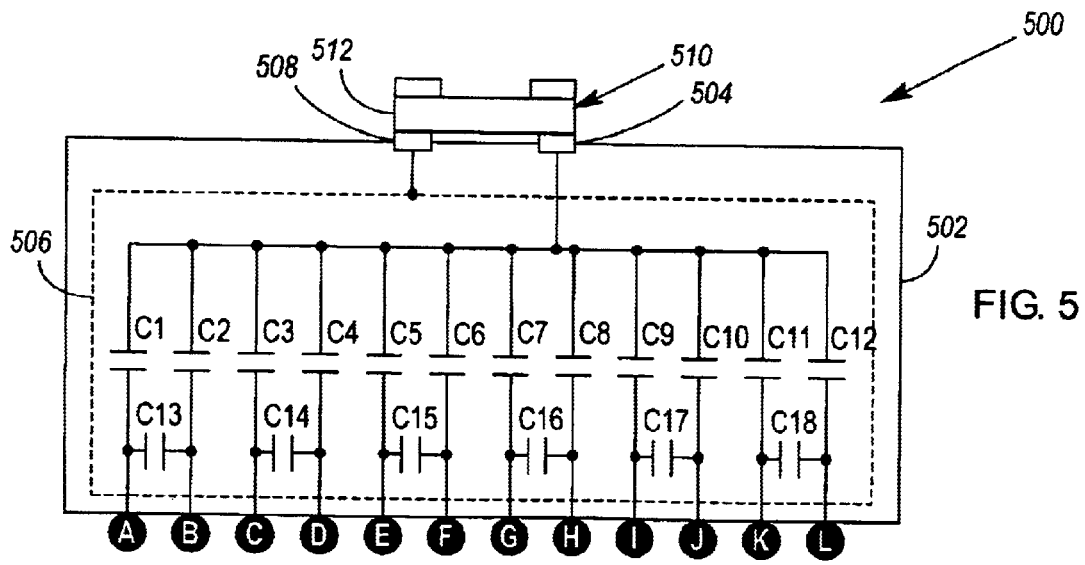
FIG. 5 illustrates a first exemplary embodiment of a device for testing continuity of electrical paths through a connector of a circuit assembly.

FIGS. 3 & 4 illustrate circuit assemblies 300, 400 comprising various forms of connectors (e.g., a socket 302 for receiving an integrated circuit (IC) package, and connectors 402, 404, 406 for receiving random access memory (RAM) modules). FIG. 5 illustrates a first exemplary embodiment of a device 500 for testing continuity of electrical paths through a connector of a circuit assembly. By way of example, the device 500 is configured to test the IC socket 302 shown in FIG. 3.

The device 500 comprises a package 502 containing incomplete or no mission circuitry for the circuit assembly 300 of which the connector under test 302 forms a part. If the device contains no mission circuitry, the device 500 may be produced based on the structural design of the connector 302, and without any knowledge of the functional design of the circuit assembly 300.

The package 502 is provided with a plurality of contacts (identified as contacts A–L) for mating to a plurality of contacts of the connector under test 302. As shown in FIG. 5, the contacts on the package may comprise solder balls of a ball grid array (BGA). The contacts could also take the form of a land grid array (LGA), pins, or other forms of contacts (e.g., PBGA, TBGA, CBGA, CCGA, CLGA, HiTCE, or organic/laminate contacts).

A test sensor port is integrated with the package 502 and may take one or more of a plurality of forms. For example, as shown in FIG. 5, the test sensor port could comprise an ohmic contact 504. Alternately (or additionally), the test sensor port could comprise a buried or external capacitor plate. If buried, the capacitor plate could be coupled to using the package 502 as a dielectric.

Integrated with (and possibly enclosed within) the package 502 are pluralities of passive circuit components (e.g., capacitors C1–C12 and C13–C18). Ones of a first plurality of the passive circuit components (capacitors C1–C12) are coupled in parallel between ones of the plurality of contacts A–L on the package 502 and the test sensor port. In FIG. 5, the passive circuit components of the first plurality are shown to be capacitors. However, the passive circuit components could take other forms, such as resistors.

Preferably, the values of parallel capacitors C1–C12 are substantially matched. That is, the relative variation between the capacitors (or error $\epsilon$) is kept to a small value, such as 0.5%. So long as the error $\epsilon$ is small and the value that the capacitors approach is small compared to the normal values of capacitance between contacts of a connector under test, the actual value that the capacitors approach need not be closely controlled. Thus, for example, if the normal values of capacitance between contacts of a connector under test are around one picoFarad (pF), the value that the parallel capacitors approach may be 15 femtoFarads (fF)±0.25%, or alternately, 14.5 fF±0.25%. Modeling considerations, however, may require keeping the values of the parallel capacitors within some sort of desired value (e.g., 15 fF±5%). The values of the parallel capacitors may be kept small compared to the normal values of connector capacitance so that insertion of the device 500 into a connector under test 302 will not add significant additional capacitance between contacts of the connector, which may be an important factor for some tests of a circuit assembly.

While the capacitors shown in the figures are generally depicted as plate-type capacitors, they need not be. Alternatively, the capacitors could be formed by parallel traces or spaced vias, the spacing and length of which are controlled to yield a desired capacitance. The capacitors could also be formed by concentric cylinders having an engineered capacitance therebetween, or by other means.

To match the values of the parallel capacitors, those of the capacitors nearest the periphery of the package 502 may need to be sized differently than those of the capacitors nearest the center of the package.

A second plurality of passive circuit components (capacitors C13–C18) is also integrated with (and possibly enclosed within) the package 502. Ones of the second plurality of passive circuit components are coupled between ones of the plurality of contacts on the package. For example, capacitor C13 is coupled between contacts A and B. Although the passive circuit components of the second plurality are shown in FIG. 5 to be capacitors, they could take other forms, such as resistors.

To prevent the passive circuit components of the device 500 from picking up stray capacitance from a circuit assembly under test 300, the components may be surrounded by a ground shield 506. The ground shield 506 may have holes therein through which component contacts and other signal wires may be routed. The ground shield 506 may be variously configured, but in one embodiment comprises upper and lower ground planes coupled by a number of conductive vias.

By way of example, the test sensor port of the device 500 may comprise an ohmic contact 508 for coupling to the ground shield 506. In this manor, a capacitive lead-frame test assembly 510 may couple the ground shield 506 to signal ground while reading the capacitance (or other electrical characteristic) of the device 500 at contact 504.

Figure 6:
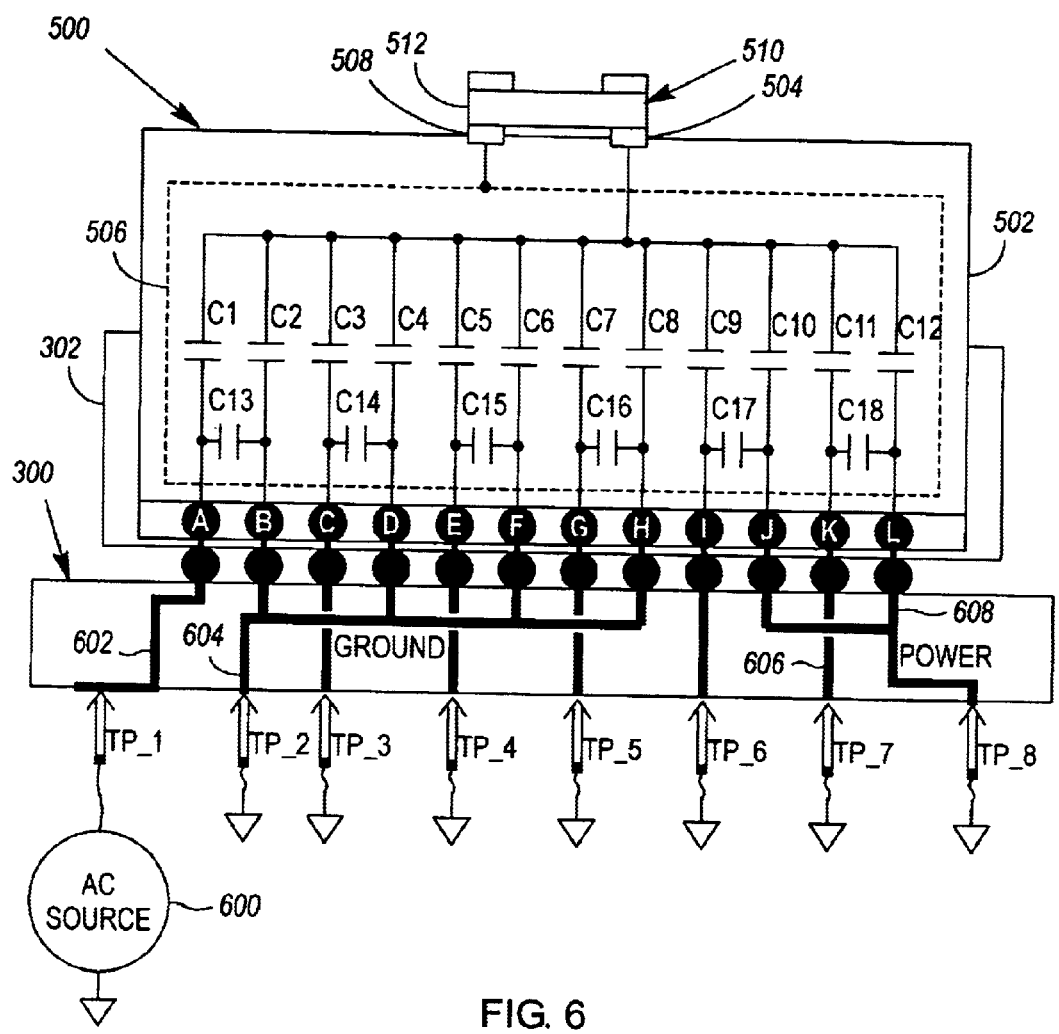
FIG. 6 illustrates the FIG. 5 device mated to the FIG. 3 connector, with a capacitive lead-frame test assembly coupled to the device.

Assume now that the device 500, configured as described in the above paragraphs, is used to test a circuit assembly 300. To prepare for test, the device 500 is mated to a connector 302 of the circuit assembly 300, as shown in FIG. 6. A capacitive lead-frame test assembly 510 is then coupled to the test sensor port 504 of the device 500. As shown, the capacitive lead-frame assembly 510 may comprise a buffer 512.

Those nodes of the circuit assembly 300 that are coupled to contacts A–L of the connector under test 302 are coupled to a number of test probes (e.g., probes $TP_{13}$ 1, $TP_{13}$ 2, $TP_{13}$ 3, $TP_{13}$ 4, $TP_{13}$ 5, $TP_{13}$ 6, $TP_{13}$ 7 and $TP_{13}$ 8). For contacts of the connector 302 that are ganged together (e.g., contacts B, D, F & H which are coupled to GROUND, and contacts J & L which are coupled to POWER), only a single test probe need be coupled to the ganged node. By way of example, the test probes shown in FIG. 6 could be included in a "bed of nails" test fixture.

After preparing the circuit assembly 300 for test, one or more nodes of the circuit assembly are stimulated (e.g., via an AC signal source 600) while other nodes of the circuit assembly are preferably grounded (to reduce noise and extraneous signal pickup). An exemplary test sequence might then commence with the stimulation of node 602 while all other nodes (e.g., nodes 604–608) of the circuit assembly 300 are grounded.

At this point of the test, and assuming that the values of capacitors C1, C2 and C13 are: C1=C, C2=C, and C13=10C, the apparatus shown in FIG. 6 may be reduced to the equivalent circuit shown in FIG. 7.

If the connector 302 is in good condition, and is properly coupled to node 602, then node 602 should be shorted to contact A of the device 500, and node 604 should be shorted to contact B of the device 500. Given that the potential at contact B is zero, the capacitance seen at port 504 should be equal to C±ε. By way of example, the capacitance seen at port 504 may be derived by measuring the current flow through port 504 using a meter 700.

Assume now that the connector 302 is faulty, or is not properly coupled to node 602, such that an open exists between node 602 and contact A. This open will result in a small capacitance being placed in series with capacitor C1, thus reducing the capacitance seen at port 504. For example, if the value of C is 15 fF, and the capacitance contributed by the open is 1 fF, then the capacitance seen at port 504 will be approximately 0.94 fF. This change in the capacitance seen at node 504 (from 15 fF to 0.94 fF), if detectable by the sensitivity of the capacitive lead-frame sensor 510 (and if greater than ε), can be used to determine that an open exists in the electrical path of contact A.

Figure 7:
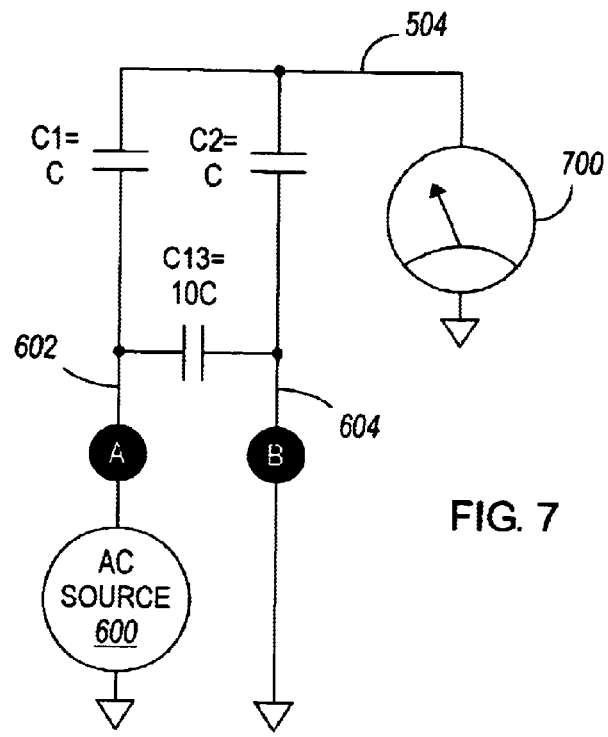
FIG. 7 illustrates an equivalent circuit for the FIG. 6 apparatus during one portion of a test.

Now assume that the connector 302 is faulty, or is not properly coupled to node 604, such that an open exists between node 604 and contact B. With contact B ungrounded, coupling capacitance C13 is now placed in series with capacitance C2. If C13 is much larger than C2 (e.g., an order of magnitude larger, as shown in FIG. 7), then the capacitance seen at port 504 will be approximately C1+C2(or 2*C in FIG. 7).

Finally, assume that the connector 302 is faulty, or is not properly coupled to both of nodes 602 and 604, such that opens exist in the electrical paths of both contacts A and B. In this case, the capacitance seen at port 504 should be near zero. Thus, if there is an open in the electrical path of contact A, it is difficult to assess whether there is also an open in the electrical path of contact B. However, stimulation of node 602 alone does allow the device 500 to provide a means for diagnosing whether an open exists in the electrical path of contact A "or" contact B.

A test of the circuit assembly 300 may continue with the stimulation of node 604 while all other nodes are grounded. Note that node 604 is a ground plane that electrically couples contacts B, D, F & H of the device 500. If the connector 302 is in good condition, and is properly coupled to node 604, then node 604 should be shorted to contacts B, D, F & H of the device, and the capacitance seen at port 504 should be equal to 4C±4ε (assuming that the values of capacitors C1–C12 are all equal to C).

Assume now that the connector 302 is faulty, or is not properly coupled to node 604, such that one or more opens exist between node 604 and ones of contacts B, D, F & H. For each open, the capacitance seen at port 504 will be reduced. For example, if there is open between node 604 and contact B, the capacitance seen at port 504 will be reduced by roughly the value of capacitor C2.

Similarly to the way in which the continuity of the electrical path of contact B can be evaluated while stimulating node 602, the continuity of the electrical paths of contacts A, C, E & G can be evaluated, to a degree, while stimulating node 604.

A test of the circuit assembly 300 may continue with sequential stimulation of the nodes connected to probes $TP_{13}$ 3–$TP_{13}$ 8.

While it was previously indicated that a defect in the electrical path of contact A would result in diagnostic ambiguity as to whether the electrical path of contact B was also faulty, diagnostic results achieved from the sequential stimulation of a plurality of nodes can be variously compared to possibly remove a diagnostic ambiguity. Furthermore, the evaluation of a plurality of diagnostic results can enable one to determine whether a defect in a supernode (such as a power or ground plane) is in the vicinity of a particular contact of the device 500, or more in the vicinity of a particular test probe (i.e., such that the defect is noted at a plurality of contacts of the device 500.

In one embodiment of the device 500, each of the second plurality of passive circuit components is configured to couple a power or ground contact of a connector under test to a signal contact of the connector. In some cases, it may be desirable that ones of the second plurality of passive circuit components couple each power and ground contact of a connector to a signal contact of the connector. It may also be desirable to ensure that each power and ground contact of a connector is coupled to a different signal contact of the connector.

Figure 8:
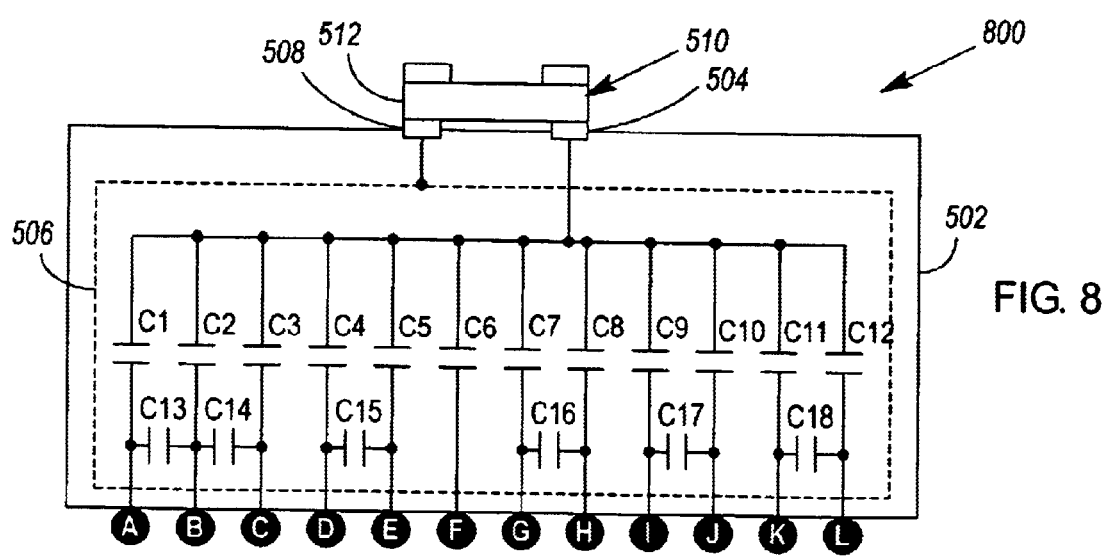
FIG. 8 illustrates a second exemplary embodiment of a device for testing continuity of electrical paths through a connector of a circuit assembly.

FIG. 8 illustrates an alternative embodiment of device 500. The device 800 is constructed similarly to the device 500, but with some contacts of the device 800 being coupled to a plurality of other contacts via coupling capacitors. For example, contact B is coupled to contacts A and C via capacitors C13 and C14. If the device 800 is placed in the socket 302 shown in FIG. 6, and node 604 of the circuit assembly 300 is then stimulated while all other nodes are grounded, the equivalent circuit shown in FIG. 9 results.

Figures 9, 10:
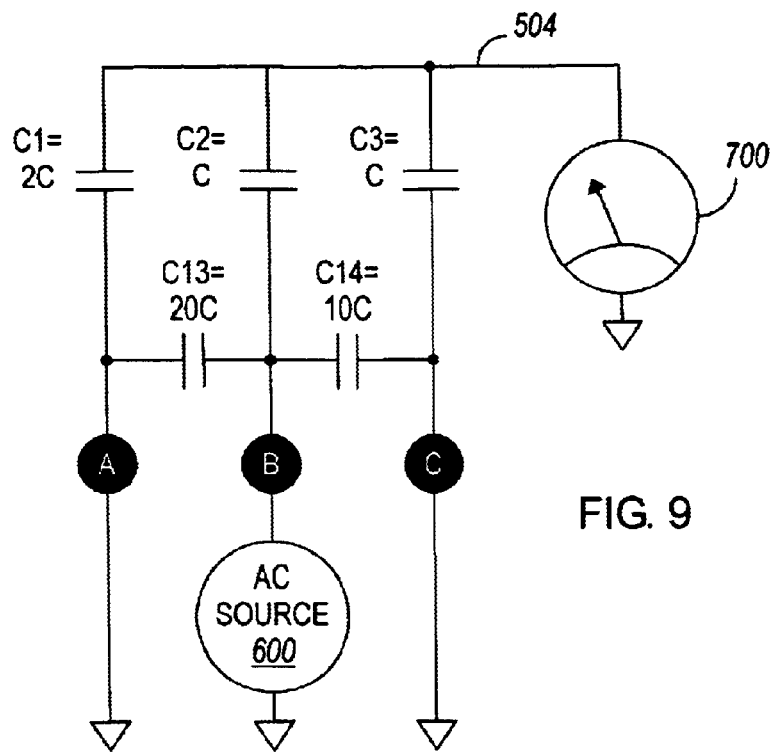
FIG. 9 illustrates an equivalent circuit for the FIG. 8 device during one portion of a test.
FIG. 10 illustrates the defects that are diagnosable by stimulating contact A of the FIG. 8 device.

In choosing values for the capacitors shown in FIG. 9, a sort of binary encoding may be implemented. That is, each of the "contact to test port capacitances" of contacts that are associated with contact B (e.g., capacitances C1 and C3) may be provided with a different value (e.g., some multiple of a value C), and each of the "coupling capacitances" associated with contact B (e.g., capacitances C13 and C14) may be chosen to be an order of magnitude greater than the capacitances C1 and C3. In this manner, a subset of contacts may be coupled to a single other contact, and the capacitances used to encode the different paths through the contacts can be used to determine which of the contacts, if any, is associated with a defective electrical path through the contacts. The table provided in FIG. 10 illustrates the capacitance seen at port 504 when various defects (or combinations of defects) are present. As in the FIG. 7 example, a degree of diagnostic ambiguity only exists when the electrical path through contact B is defective, thus potentially masking additional defects with the electrical paths through contacts A and C. However, by stimulating nodes B and C and determining the capacitances associated with the tests of each of these nodes, it will often be possible to eliminate any diagnostic ambiguity resulting from the stimulation of contact A alone.

It should be noted that the device 800 need not be limited to the interconnection of three of its contacts via coupling capacitances. In more general terms, a first set of components comprised of ones of the first plurality of passive circuit components (e.g., capacitors C1 & C3) may be coupled to a contact of the package (e.g., contact B) via a second set of components comprised of ones of the second plurality of passive circuit components (e.g., capacitors C13 & C14).

It should also be noted that the device 800 need not interconnect all of its contacts in groups of three or more. Thus, as shown, some contacts (e.g., contact F) need not be coupled to any other contacts, and some contacts (e.g., contacts D, E & G–L) may only be coupled in pairs.

Figure 11:
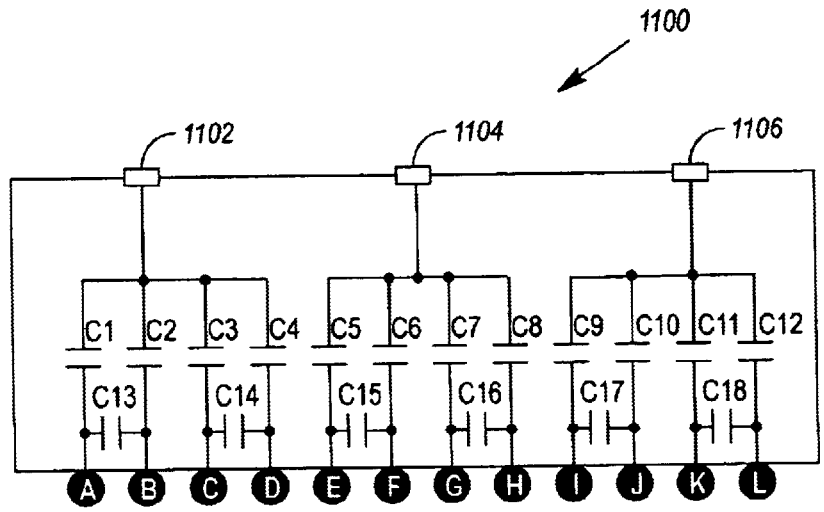
FIG. 11 illustrates a third exemplary embodiment of a device for testing continuity of electrical paths through a connector of a circuit assembly.

For the devices shown in FIGS. 5 & 8, the values of the parallel capacitors C1–C12, the values of the coupling capacitors C13–C18, and the error, ε, may be chosen or limited such that a particular capacitive lead-frame test assembly can distinguish between the combined capacitance of N versus N−1 capacitors (or distinguish between a multiple of N or N−1 times a value C). However, the sensitivity of a particular capacitive lead-frame test assembly will sometimes dictate the maximum value of N. In this case, a device 1100 may be provided with additional test sensor ports 1102, 1104, 1106 (see FIG. 11). The contacts (A–L) of the device 1100 may then be divided into groups such that a different set of passive components (e.g., C1–C4, C5–C8, C9–C12) is coupled in parallel between each set of contacts and its corresponding test sensor port 1102–1106. The parallel components coupled to each test sensor port may then be interconnected via coupling capacitances as shown in FIGS. 5 or 8. In testing a circuit assembly, a plurality of test buffers may be coupled to the device's test sensor ports 1102–1106 in parallel, or a single test buffer may be sequentially coupled to ones of the test sensor ports 1102–1106.

Figure 12:
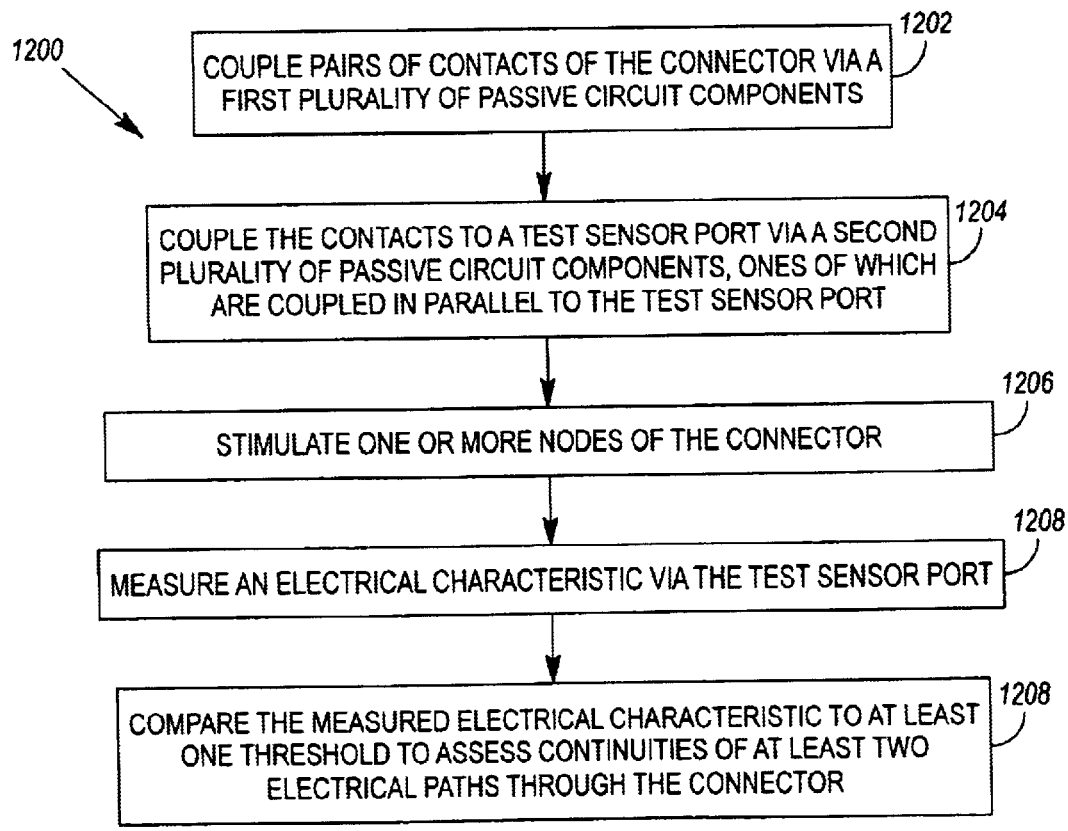
FIG. 12 illustrates a method for testing continuity of electrical paths through a connector.

FIG. 12 illustrates a method 1200 for testing continuity of electrical paths through a connector of a circuit assembly using any of the above-described test devices (as well as others). The method 1200 commences with the coupling 1202 of pairs of contacts of the connector via a first plurality of passive circuit components. The contacts of the connector are also coupled 1204 to a test sensor port via a second plurality of passive circuit components, each of which is coupled in parallel between the contacts and the test sensor port. One or more nodes of the connector are then stimulated 1206, and an electrical characteristic is measured via the test sensor port. The measured electrical characteristic is then compared 1208 to at least one threshold to assess continuities of at least two electrical paths through the connector. If the measured electrical characteristic is capacitance, the capacitance may be measured by means of a capacitive lead-frame assembly.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A device for testing continuity of electrical paths through a connector of a circuit assembly, comprising:
    a package containing incomplete or no mission circuitry for the circuit assembly;
    a plurality of contacts on the package for mating to a plurality of contacts of the connector;
    a test sensor port, integrated with the package;
    a first plurality of passive circuit components integrated with the package, ones of which are coupled in parallel between ones of the plurality of contacts on the package and the test sensor port; and
    a second plurality of passive circuit components integrated with the package, coupled between ones of the plurality of contacts on the package.

2. The device of claim 1, wherein each of the second plurality of passive circuit components is configured to couple a power or ground contact of the connector to a signal contact of the connector.

3. The device of claim 1, wherein ones of the second plurality of passive circuit components are configured to couple each power and ground contact of the connector to a signal contact of the connector.

4. The device of claim 1, wherein ones of the second plurality of passive circuit components are configured to couple each power and ground contact of the connector to a different signal contact of the connector.

5. The device of claim 1, wherein, a first of the second plurality of passive circuit components is configured to couple a first of two or more electrically coupled contacts of the connector to a first signal contact of the connector.

6. The device of claim 5, wherein a second of the second plurality of passive circuit components is configured to couple a second of the two or more electrically coupled contacts of the connector to a second signal contact of the connector.

7. The device of claim 1, wherein:
a first set of components comprised of ones of the first plurality of passive circuit components is coupled to a contact of the package via a second set of components comprised of ones of the second plurality of passive circuit components; and
each component of the first set has a different value.

8. The device of claim 7, wherein each component of the second set has a different value.

9. The device of claim 1, wherein each of the passive circuit components is a capacitor.

10. The device of claim 9, wherein values of the second plurality of passive circuit components are greater than values of the first plurality of passive circuit components.

11. The device of claim 9, wherein values of the second plurality of passive circuit components are an order of magnitude greater than values of the first plurality of passive circuit components.

12. The device of claim 1, wherein each of the first plurality of passive circuit components is a capacitor, and wherein values of the capacitors are substantially matched.

13. The device of claim 1, wherein the connector is a socket, and wherein the package is configured to mate to the socket.

14. A method for testing continuity of electrical paths through a connector, comprising:
coupling pairs of contacts of the connector via a first plurality of passive circuit components;
coupling the contacts to a test sensor port via a second plurality of passive circuit components, ones of which are coupled in parallel to the test sensor port;
stimulating one or more nodes of the connector;
measuring an electrical characteristic via the test sensor port; and
comparing the measured electrical characteristic to at least one threshold to assess continuities of at least two electrical paths through the connector.

15. The method of claim 14, wherein coupling pairs of contacts of the connector comprises using ones of the first plurality of passive circuit components to couple power and ground contacts of the connector to signal contacts of the connector.

16. The method of claim 14, wherein coupling pairs of contacts of the connector comprises using ones of the first plurality of passive circuit components to couple each power and ground contact of the connector to a different signal contact of the connector.

17. The method of claim 14, wherein coupling pairs of contacts of the connector comprises using a first of the first plurality of passive circuit components to couple a first of two or more electrically coupled contacts of the connector to a first signal contact of the connector.

18. The method of claim 17, wherein coupling pairs of contacts of the connector comprises using a second of the first plurality of passive circuit components to couple a second of the two or more electrically coupled contacts of the connector to a second signal contact of the connector.

19. The method of claim 14, wherein coupling pairs of contacts of the connector comprises using ones of the first plurality of passive circuit components, each of which has a different value, to couple a subset of contacts of the connector to another contact of the connector.

20. The method of claim 19, wherein each of the second plurality of passive circuit components coupling one of the subset of contacts to the test sensor port has a different value.

21. The method of claim 14, wherein the passive circuit components are capacitors.

22. A method for testing continuity of electrical paths through a circuit assembly, comprising:
mating a test-facilitating circuit package to a connector of the circuit assembly; the circuit package comprising a plurality of contacts for mating to a plurality of contacts of the connector; the circuit package containing incomplete or no mission circuitry for the circuit assembly, but containing first and second pluralities of passive circuit components; wherein ones of the first plurality of passive circuit components are coupled in parallel between ones of the plurality of contacts on the package and a test sensor port, and wherein the second plurality of passive circuit components are coupled between ones of the plurality of contacts of the circuit package;
stimulating one or more nodes of the circuit assembly;
measuring an electrical characteristic of the circuit package; and
comparing the measured electrical characteristic to at least one threshold to assess continuities of at least two electrical paths through the circuit assembly.

23. The method of claim 22, wherein the measured electrical characteristic is capacitance.

24. The method of claim 22, wherein the electrical characteristic is measured via a capacitive lead-frame assembly.

* * * * *